(12) United States Patent
Kim

(10) Patent No.: US 6,498,389 B1
(45) Date of Patent: Dec. 24, 2002

(54) ULTRA-THIN SEMICONDUCTOR PACKAGE DEVICE USING A SUPPORT TAPE

(75) Inventor: Pyoung Wan Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/058,123

(22) Filed: Jan. 29, 2002

(30) Foreign Application Priority Data

Jul. 16, 2001 (KR) ......................................... 2001-42792

(51) Int. Cl.[7] .......................... H01L 23/48; H01L 23/28; H01L 29/44; H05K 3/30
(52) U.S. Cl. ........................ 257/673; 257/666; 257/696; 257/698; 257/672; 257/671; 257/670; 257/784; 257/786; 257/687; 257/668
(58) Field of Search ................................ 257/666, 673, 257/669, 672, 671, 670, 690–693, 696, 698, 784, 786, 687, 667, 668

(56) References Cited

U.S. PATENT DOCUMENTS

| | | | |
|---|---|---|---|
| 4,800,419 A | * | 1/1989 | Long et al. |
| 5,196,992 A | * | 3/1993 | Sawaya ........................ 361/392 |
| 5,214,845 A | * | 6/1993 | King et al. ................... 257/668 |
| 5,343,074 A | * | 8/1994 | Higgins, III et al. ........ 257/668 |
| 5,352,632 A | * | 10/1994 | Sawaya |
| 5,442,231 A | * | 8/1995 | Miyamoto et al. ........... 257/666 |
| 5,583,371 A | * | 12/1996 | Hori ............................. 257/675 |
| 5,585,668 A | * | 12/1996 | Burns ........................... 257/676 |
| 5,594,626 A | * | 1/1997 | Rostoker et al. ............. 257/678 |
| 5,604,376 A | | 2/1997 | Hamburgen et al. ......... 257/676 |
| 5,701,028 A | * | 12/1997 | Waki ............................ 257/666 |
| 5,735,030 A | | 4/1998 | Orcutt ............................. 29/86 |
| 5,970,320 A | * | 10/1999 | Yamasaki et al. ............ 438/123 |
| 6,006,981 A | * | 12/1999 | Madrid ..................... 228/180.5 |
| 6,046,504 A | * | 4/2000 | Kimura ......................... 257/775 |
| 6,258,621 B1 | * | 7/2001 | Ohuchi et al. ............... 438/106 |
| 6,326,243 B1 | * | 12/2001 | Suzuya et al. ............... 438/124 |
| 6,344,688 B1 | * | 2/2002 | Wang ............................ 257/724 |
| 2001/0008308 A1 | * | 7/2001 | Shen ............................ 257/723 |

* cited by examiner

Primary Examiner—Alexander O. Williams
(74) Attorney, Agent, or Firm—Lee & Sterba, P.C.

(57) ABSTRACT

An ultra-thin semiconductor package device comprises a heat-resistant film-type adhesive support tape which connects a semiconductor chip to a plurality of individual lead frames, wherein each lead frame is connected to an associated one of a plurality of electrode pads of the semiconductor chip by a plurality of bonding wires. An encapsulating molding material provides environmental protection for the completed package. Within the encapsulating molding, the semiconductor chip is mounted on a same underside of the support tape as the plurality of lead frames, such that the bottom of the semiconductor chip is aligned with the bottom of an encapsulating molding, and the height of a loop in each bonding wire is minimized.

16 Claims, 5 Drawing Sheets

ULTRA-THIN SEMICONDUCTOR PACKAGE DEVICE USING A SUPPORT TAPE

BACKGROUND OF THE INVENTION

1. Field of the Invention

The present invention relates to semiconductor packaging technology.

More particularly, the present invention relates to an ultra-thin semiconductor package having a thickness of 0.5 mm using a film-type adhesive support tape.

2. Description of Related Art

Recently, as the supply of various portable electronic devices such as digital cameras, MP3 players, handheld personal computers (HPC) and personal digital assistants (PDA) expands, new technologies are required to produce semiconductor packages having a smaller and thinner structure.

FIG. 1 illustrates an end view of a conventional semiconductor package device 10 using a lead frame. The package device 10 includes a semiconductor chip 1 and a lead frame 2. The lead frame 2 includes a plurality of leads 4 and a die pad 3 to which the semiconductor chip 1 is attached using an adhesive 5. Each one of the plurality of leads 4 is connected to semiconductor chip 1 by a bonding wire 6 and further includes an inner lead 4a encapsulated by a molding body 7 and an outer lead 4b exposed from the molding body 7 and having a structure suitable for mounting on an external device.

In conventional package 10, total thickness of the package 10 is determined by the thickness of the semiconductor chip 1, the die pad 3, the adhesive 5 and a loop in each bonding wire 6. The thickness of a semiconductor chip 1 manufactured from an 8-inch wafer, the adhesive 5, the wire loop and the die pad 3 are generally 300 $\mu$m, 50 $\mu$m, 80–100 $\mu$m and 100–150 $\mu$m, respectively. Due to the thickness of the molding body 7 above and below the semiconductor chip 1 and a stand-off of the outer lead 4b, it is impossible to embody a conventional package having a thickness of less than 0.5 mm.

FIG. 2 illustrates an end view of a conventional semiconductor package device having a lead-on-chip (LOC) structure. In a package 20 shown in FIG. 2, a plurality of electrode pads are formed in the center of an active surface of a semiconductor chip 11, and an inner lead 14a of each one of a plurality of leads 14 is directly attached to the periphery of the active surface. In this structure, each lead 14 is mounted on the semiconductor chip 11. Each inner lead 14a is attached to a chip surface by an adhesive 13 and is electrically connected to an electrode pad of the semiconductor chip 11 by a bonding wire 16. The semiconductor chip 11, inner leads 14a and bonding wires 16 are encapsulated by a molding body 17. An outer lead 14b of each of the plurality of leads 14 is exposed from the molding body 17.

Disadvantageously, although the inner lead 14a in the package 20 of FIG. 2 functions similar to the die pad 3 in the package 10 of FIG. 1, total thickness of a package cannot be reduced due to the wire loop 16 above the inner lead 14a. Further, although conventional semiconductor packages may be made thinner by reducing the thickness of the semiconductor chip and/or the lead frame, such thinner elements are less durable and may be easily broken during routine handling.

SUMMARY OF THE INVENTION

According to a feature of an embodiment of the present invention, there is provided an ultra-thin semiconductor package device using plastic package technology.

According to another feature of an embodiment of the present invention, there is provided a semiconductor package device having a thickness of less than 0.5 mm capable of maintaining proper thickness of a semiconductor chip or a lead frame.

According to an aspect of an embodiment of the present invention, a semiconductor package device uses a heat-resistant support tape instead of a die pad as a lead frame. The support tape is preferably a film-type adhesive tape. The semiconductor package device includes a semiconductor chip having an active surface in which a plurality of electrode pads are formed and a bottom surface opposite of the active surface, a plurality of lead frames connected to each electrode pad of the semiconductor chip, including an inner lead having an upper surface, wherein the height of the upper surface is equal to the height of the active surface (i.e., the two surfaces are aligned), a plurality of bonding wires, each electrically connecting one electrode pad of the semiconductor chip with an associated inner lead, and a molding body encapsulating the semiconductor chip, the support tape and the plurality of bonding wires, wherein the heat-resistant support tape is attached to the upper surface of the inner lead and the active surface of the semiconductor chip and supports the inner lead and the semiconductor chip.

The support tape includes a plurality of electrode pad opening areas and a plurality of bonding part opening areas for exposing the electrode pads of the semiconductor chip and a bonding part of the inner lead to which each of the plurality of the bonding wires are attached. Each electrode pad opening area of the support tape is individually formed to align with each of electrode pads or is formed as one body to align with a row of electrode pads. Also, the support tape may include an active surface opening area partially exposing a portion of the active surface of the semiconductor chip, which is directly contacted to the molding body. Preferably, a bottom surface of the molding body and the bottom surface of the semiconductor chip are aligned, and the bottom surface of the semiconductor chip is exposed from the molding body.

According to another aspect of an embodiment of the present invention, a semiconductor package device is provided which includes a semiconductor chip having an active surface in which a plurality of electrode pads are formed and a bottom surface opposite of the active surface, a plurality of lead frames, each connected to one of the plurality of electrode pads of the semiconductor chip, and each one including a plurality of inner leads having an upper surface, wherein the height of the upper surface is equal to the height of the active surface (i.e., the two surfaces are aligned), a heat-resistant support tape having a plurality of first bonding parts, a plurality of second bonding parts and a routing pattern connecting each first bonding part with an associated second bonding part, attached to the upper surface of the inner lead and the active surface of the semiconductor chip, and supporting the plurality of inner leads and the semiconductor chip. A first bonding wire electrically connects each one of the electrode pads of the semiconductor chip with an associated one of the first bonding parts, and a second bonding wire electrically connects each one of the second bonding parts with an associated one of the inner leads. After the wire bonding is completed, a molding body encapsulates the semiconductor chip, the support tape and the first and second bonding wires.

The support tape further includes an electrode pad opening area and a bonding part opening area for exposing the plurality of electrode pads of the semiconductor chip and a third bonding part of the inner lead to which each first and second bonding wires are attached. Also, the support tape may further include an active surface opening area partially exposing a portion of the active surface of the semiconductor chip, and the exposed portion is directly contacted to and adhering to the molding body. The support tape may be wholly or partially attached to the active surface of the semiconductor chip.

These and other features and aspects of the present invention will be readily apparent to those of ordinary skill in the art upon review of the detailed description that follows.

DETAILED DESCRIPTION OF THE INVENTION

Korean Patent Application No. 2001–42792, filed on Jul. 16, 2001, and entitled: "Ultra-thin Semiconductor Package Device Using A Support Tape," is incorporated by reference herein in its entirety.

The present invention will now be described more fully hereinafter with reference to the accompanying drawings, in which preferred embodiments of the invention are shown. The present invention may, however, be modified in different forms and should not be construed as limited to the embodiments set forth herein. Rather, these embodiments are provided so that this disclosure will be thorough and complete, and will fully convey the scope of the present invention to those of ordinary skill in the art. Like reference numbers refer to like elements throughout.

Figure 1:
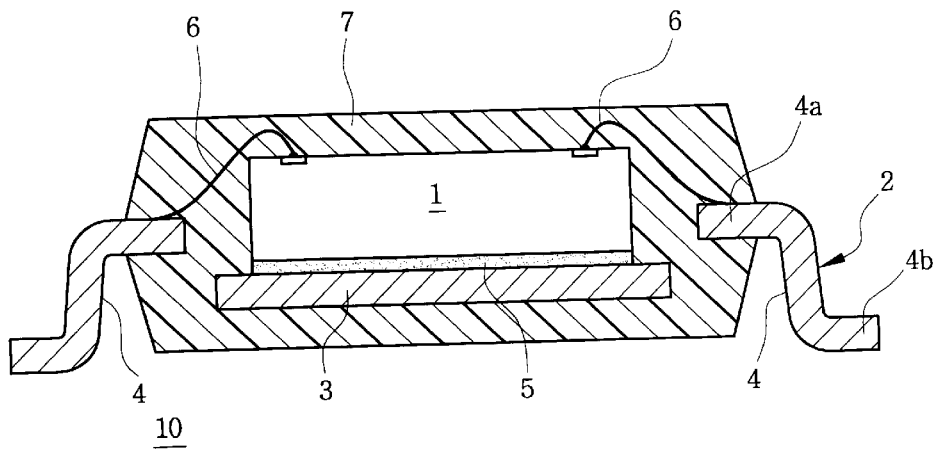
FIG. 1 illustrates an end view of a conventional semiconductor package device using a lead frame.
Figure 2:
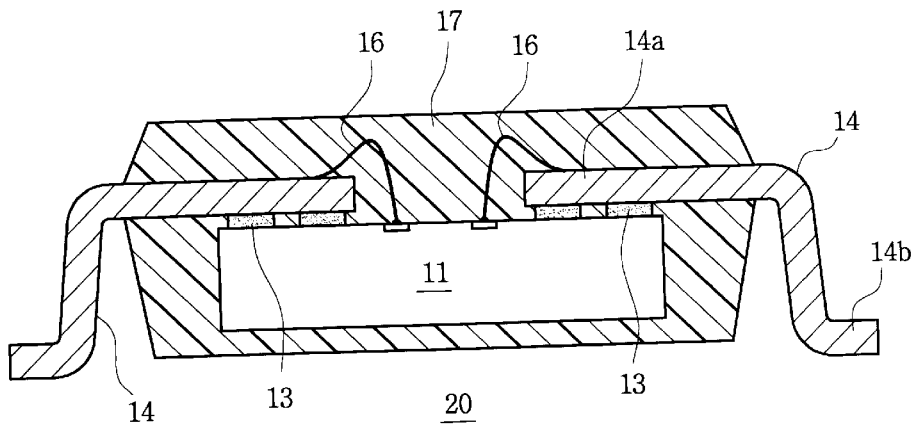
FIG. 2 illustrates an end view of a conventional semiconductor package device having a lead-on-chip (LOC) structure.
Figure 3:
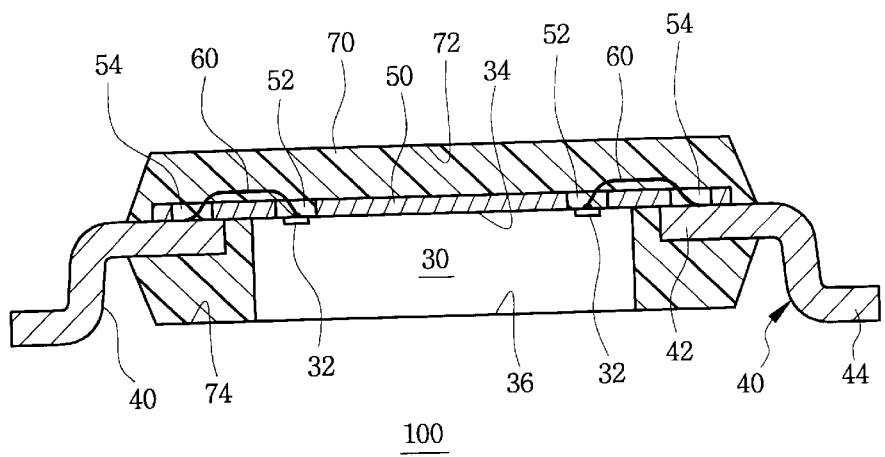
FIG. 3 illustrates an end view of an ultra-thin semiconductor package device according to an embodiment of the present invention.

FIG. 3 illustrates an end view of an ultra-thin semiconductor package device 100 according to an embodiment of the present invention.

Referring to FIG. 3, an ultra-thin package device 100 includes a semiconductor chip 30, a plurality of leads 40 of a lead frame, a support tape 50 and an encapsulating molding body 70. Semiconductor chip 30 has an active surface 34 in which a plurality of electrode pads 32 are formed and a bottom surface 36 on an opposite side from the active surface 34. On-chip circuits are formed on the active surface 34 using conventional wafer fabricating processes, as are known in the art, and a detailed explanation thereof will be omitted.

Each lead 40 is preferably comprised of a metal alloy, such as a copper alloy or an iron-nickel alloy (Alloy-42), and disposed apart from the semiconductor chip 30. Each lead 40 further includes an inner lead 42 included within the molding body 70 and an outer lead 44 exposed from the molding body 70 and bent in a gull-wing shape. The package device shown in FIG. 3 has a footprint of an industry standard small outline package (SOP). The height of an upper surface of the inner lead 42 is equal to the height of the active surface 34 of semiconductor chip 30 (i.e., the surfaces are aligned.)

Each inner lead 42 is connected to one of the plurality of electrode pads 32 of the semiconductor chip 30 by a conductive bonding wire 60. Each bonding wire 60, which is preferably a gold (Au) wire, electrically connects a ball formed in electrode pad 32 to a stitch formed in a bonding part of the inner lead 42. A loop having a predetermined height is needed above the ball of the bonding wire 60 for flexibility during manufacturing, but in order to reduce the height of the loop, a reverse bonding wire may be used. For example, a ball may be formed in the bonding part of the inner lead 42 and a stitch may be formed in the electrode pad 32 of the semiconductor chip 30. When the reverse bonding wire is used, the height of the upper surface of the inner lead 42 may be aligned to be lower than the height of the active surface 34 of the semiconductor chip 30.

The support tape 50 may be a film-type adhesive tape comprised of a polyimide. The support tape 50 is preferably partially attached to the active surface 34 of the semiconductor chip 30 and the upper surface of the inner lead 42. An opening area 52 for exposing the electrode pad 32 of the semiconductor chip 30 and an opening area 54 for exposing the bonding part of the inner lead 42 are preferably formed in the support tape 50 to accommodate the ends of each bonding wire 60.

Molding body 70 may be formed by injecting a high temperature liquid epoxy molding resin into a die and hardening the liquid epoxy molding resin. Molding body 70 encapsulates the semiconductor chip 30, the plurality of inner leads 42 and the plurality of bonding wires 60 to provide protection from a detrimental external environment. The molding body 70 includes a top surface 72 and a bottom surface 74. The bottom surface 74 of the molding body 70 is on the same line as, or aligned with, the bottom surface 36 of the semiconductor chip 30. That is, the bottom surface 36 of the semiconductor chip 30 is not included in the molding body 70, but exposed to the external environment. Because the molding body 70 is not formed in the bottom surface 36 of the semiconductor chip 30, an increase of total thickness due to the molding body 70 does not occur as in the conventional packages.

The outer lead 44 exposed from the molding body 70 is formed as one body with the inner lead 42, and is bent to a shape suitable for mounting the package device 100 to an external device, such as a mother board of a computer system. A bottom surface of the outer lead 44 is an exemplary 50 μm or 100 μm lower than the bottom surface 74 of molding body 70.

According to the present embodiment, because a thin film-type support tape is used, there is no increase in package thickness due to a die pad (as in a conventional lead frame structure), a lead of a lead frame (in a conventional LOC structure), or an existing molding body (in a bottom surface of a semiconductor chip.) Further, a structure (the support tape) supporting the lead and the semiconductor chip has no influence on the thickness of a package device. Thus, an ultra-thin semiconductor package having a thickness of less than 0.5 mm may be created using the features of the present invention.

For example, assuming that semiconductor chip 30, support tape 50, a loop of a bonding wire 60, an inner lead 42, molding resin 70 on the semiconductor chip and a stand-off of an outer lead are generally 300 µm, 50 µm, 80 µm, 100–150 µm, 150 µm, and 50 µm in thickness, respectively, the total thickness of the package device becomes 0.5 mm (300 µm+150 µm+50 µm). Since the thickness of the support tape 50 (50 µm) is less than the thickness of the loop of the bonding wire 60 (80 µm), the thickness of the support tape 50 has no influence on the total thickness of the package device 100. Also, because the thickness of the inner lead 42 (100–150 µm) is less than the thickness of the semiconductor chip 30 (300 µm), there is no increase of total thickness due to inner lead 42. Meanwhile, if the thickness of the semiconductor chip 30 is reduced to 100–150 µm by a wafer back lapping operation, the total thickness of the package device 100 may be reduced to approximately 0.35–0.4 mm.

FIGS. 4a through 4e illustrate the steps of a process for manufacturing an ultra-thin semiconductor package device according to an embodiment of the present invention. Although it is understood that a plurality of openings and bonding wires exist in the following embodiments, for clarity of explanation in the following discussion, only a single connection is addressed without limiting the invention to such. The discussion should logically be assumed to be expanded by a person of ordinary skill in the art to include each selected ones of the plurality of connections and pads.

Figure 4A:
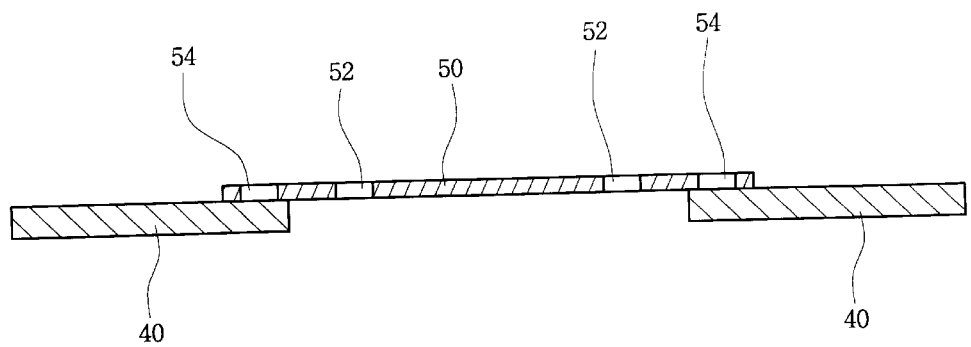
FIGS. 4a through 4e illustrate preferred steps for manufacturing an ultra-thin semiconductor package device according to an embodiment of the present invention.
Figure 4B:
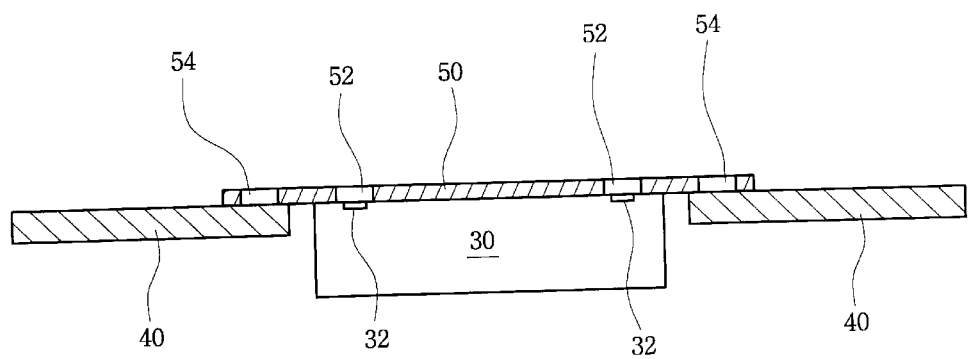
Figure 4C:
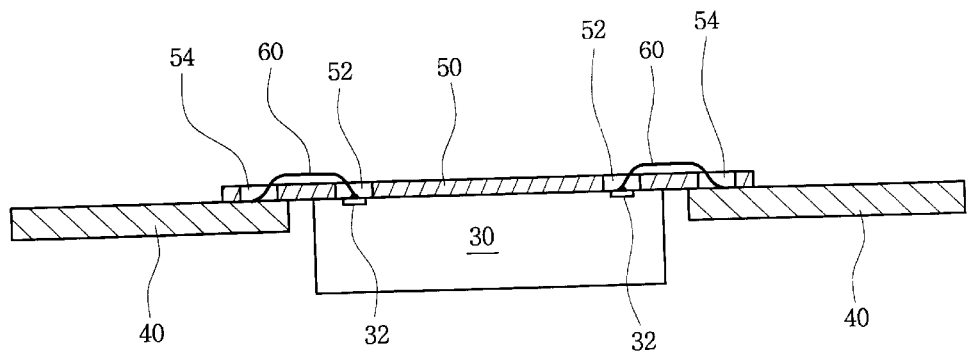

In a first step, as shown in FIG. 4a, support tape 50 having an electrode pad opening area 52 and a bonding part opening area 54 is attached to an upper surface of lead frame 40. In a second step, as shown in FIG. 4b, a semiconductor chip 30 is preferably attached to a bottom surface of support tape 50, such that an electrode pad 32 of the semiconductor chip 30 is aligned with the electrode pad opening area 52. Next, as shown in FIG. 4c, a bonding wire 60 is connected to electrode pad 32 of semiconductor chip 30 through electrode pad opening area 52 and to lead frame 40 through bonding part opening area 54 using a general wire bonding process.

Figure 4D:
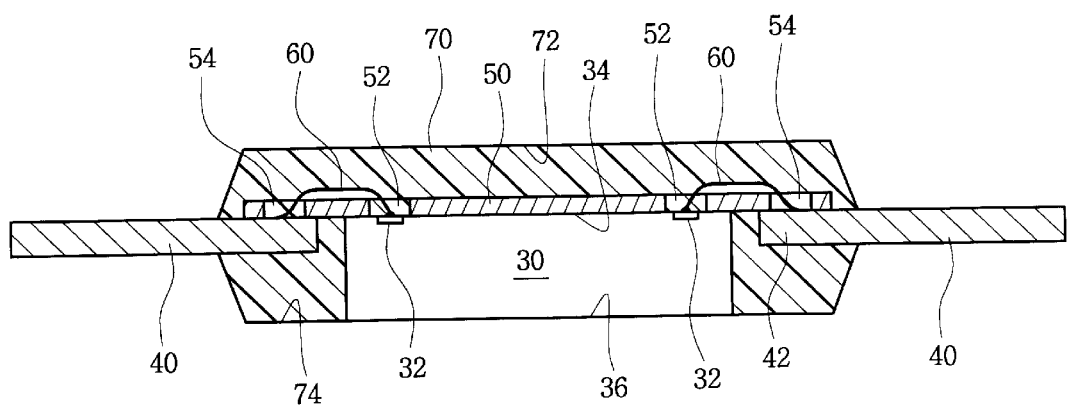
Figure 4E:
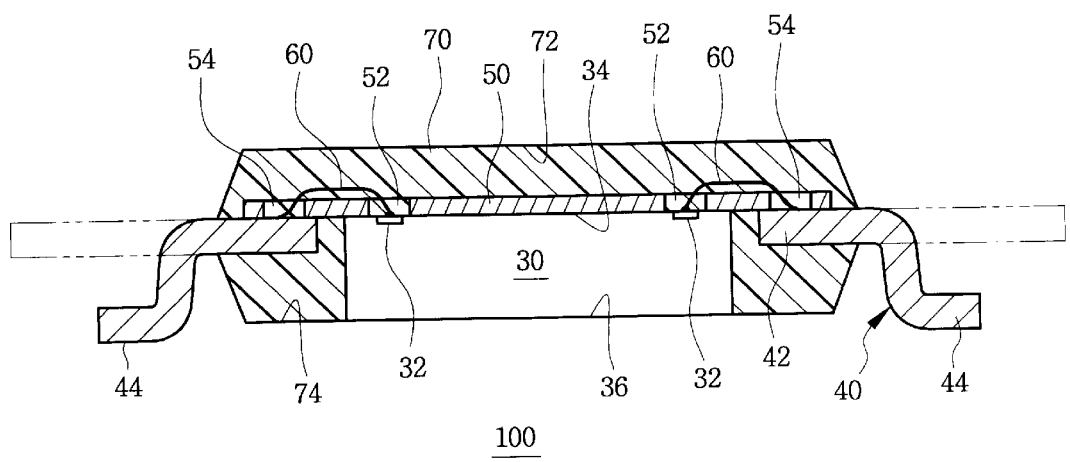

Referring to FIG. 4d, a package molding body 70 may then be formed using an injection molding process, such that a bottom surface 74 of the molding body 70 is on the same line with a bottom surface 36 of the semiconductor chip 30. As shown in FIG. 4e, an ultra-thin package device 100 may then be obtained by bending an outer lead 44 to a desired shape in a final step.

The support tape 50 according to the present invention may be embodied in various configurations.

Figure 5:
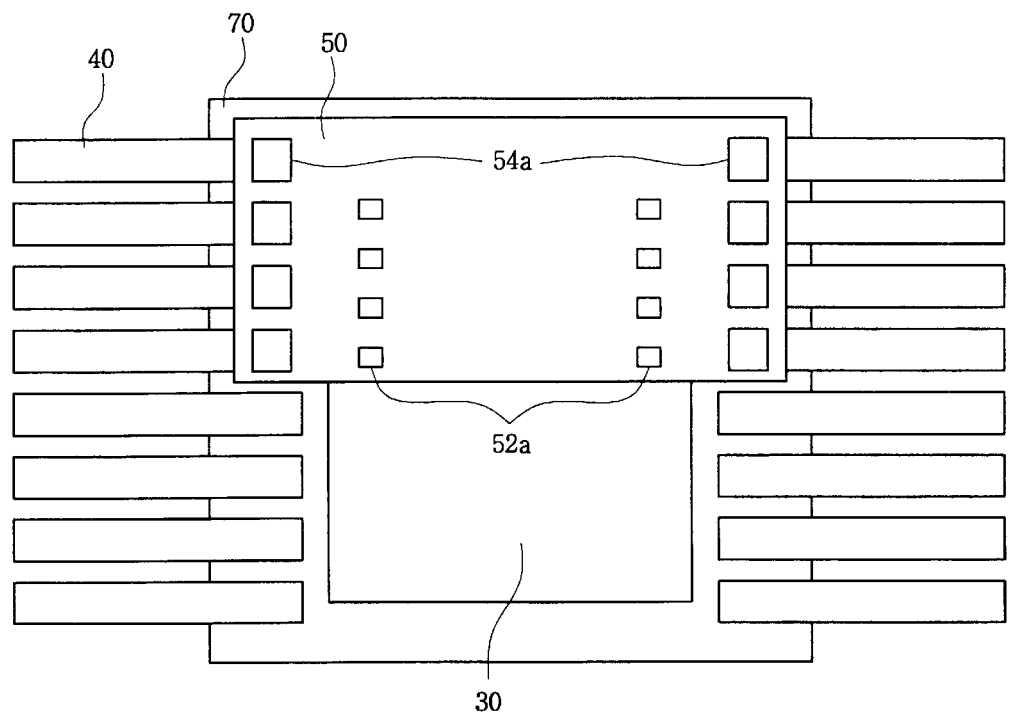
FIG. 5 illustrates a cut-away top view of a support tape used in an ultra-thin semiconductor package device according to an embodiment of the present invention.

As shown in FIG. 5, support tape 50 may be configured to be attached partially to an active surface of a semiconductor chip 30 and inner leads (not shown). The support tape 50 of FIG. 5 includes a plurality of electrode pad opening areas 52a comprised individually with respect to each electrode pad and a plurality of bonding part opening areas 54a comprised individually with respect to each bonding part of the inner portion of lead frames 40. Because portions of the active surface of semiconductor chip 30 and the inner leads that are not attached to support lead 50 may be directly contacted with a molding body 70, an adhesive characteristic between the semiconductor chip 30 and the molding body 70 may be improved.

Figure 6:
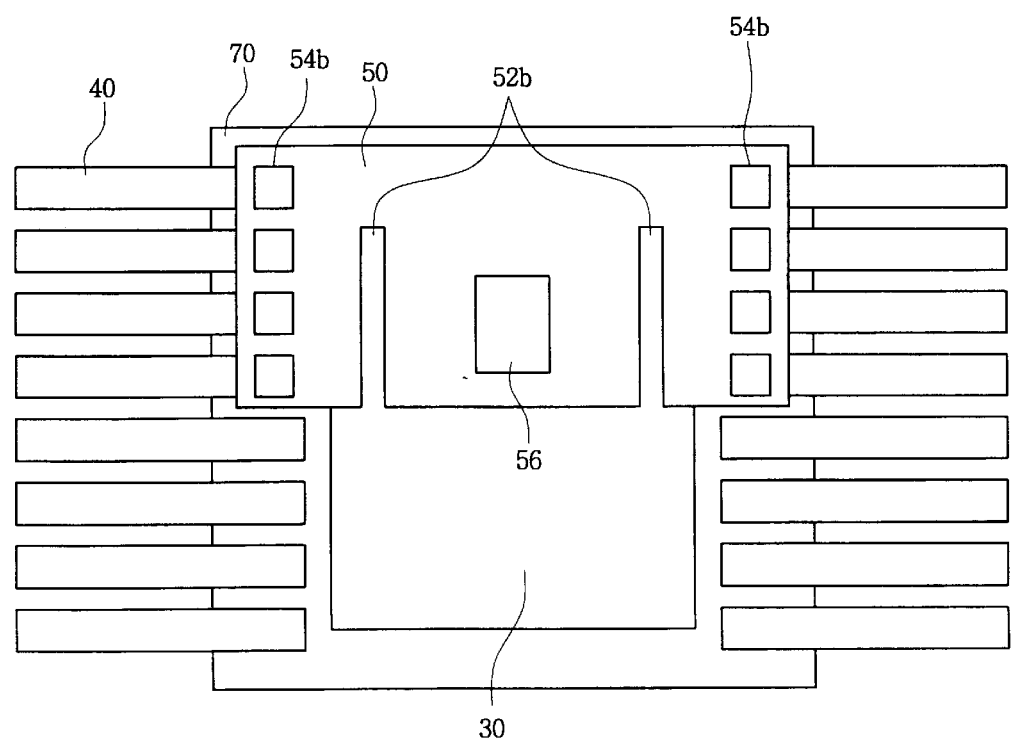
FIG. 6 illustrates a cut-away top view of another support tape used in an ultra-thin semiconductor package device according to an embodiment of the present invention.

Meanwhile, as shown in FIG. 6, a support tape 50 may be configured to include a plurality of electrode pad opening areas 52b comprised as one body with respect to a row of electrode pads and a plurality of bonding part opening areas 54b comprised individually with respect to each bonding part of the inner portion of lead frames 40. Also, the support tape 50 of FIG. 6 may further include an active surface opening area 56 exposing some portion of an active surface of semiconductor chip 30 to improve adhesive characteristic between semiconductor chip 30 and molding body 70.

In FIG. 5 and FIG. 6, although the support tape is attached to some portion of the semiconductor chip and the inner leads, it will be easily understood by those of ordinary skill in the art that the support tape may be attached to cover the active surface of the semiconductor chip entirely. In such a case, the active surface opening area (56 in FIG. 6) in the support tape may be formed to improve an adhesive characteristic between the molding body and the semiconductor chip.

Figure 7A:
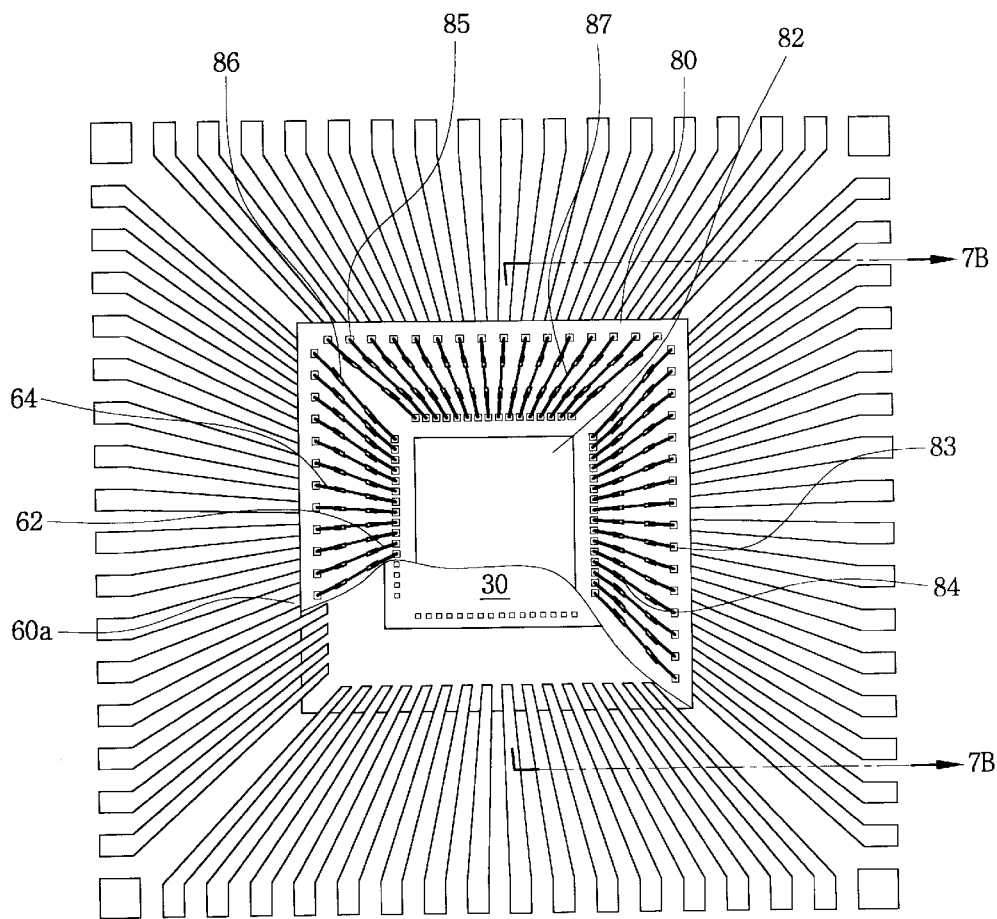
FIGS. 7a and 7b illustrate a sectional top view and a cross-sectional view, respectively, of an ultra-thin semiconductor package device according to another embodiment of the present invention.

FIG. 7a illustrates a sectional top view of an ultra-thin semiconductor package device according to another embodiment of the present invention.

Figure 7B:
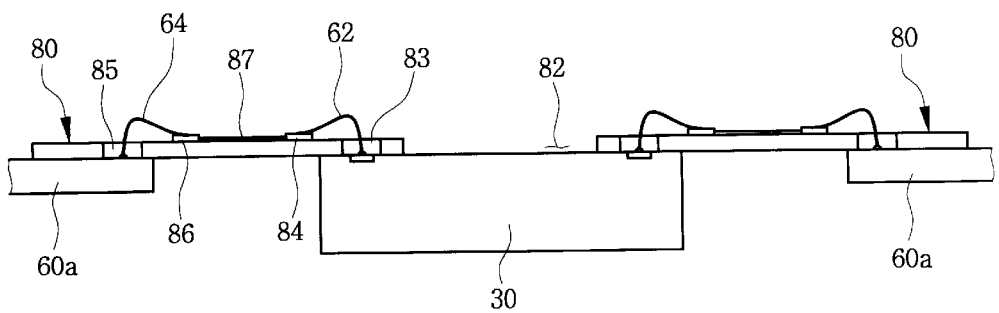

FIG. 7b illustrates a cross-sectional view taken along a section line 7B—7B of FIG. 7a.

In this embodiment, a support tape 80 is preferably attached to cover an active surface of a semiconductor chip 30 and a bonding part of an inner lead portion of a plurality of leads 60a entirely. The support tape 80 includes an active surface opening area 82 in a center portion. For each one of a plurality of electrode pads of semiconductor chip 30, support tape 80 preferably includes an electrode pad opening area 83, a bonding part opening area 85, a first bonding pad 84 and a second bonding pad 86. The first bonding pad 84 and the second bonding pad 86 may be electrically connected to each other by a conductive routing pattern 87.

The support tape 80 as shown in FIG. 7a may be adapted to a quad flat package (QFP) device in which a plurality of leads 60a are attached to the four sides of the semiconductor chip 30. The QFP device is suitable for package devices where many input/output pins are required. As the number of input/output pins increases, the number of inner leads also increases. Thus, a space or pitch between the inner leads decreases, and a distance between the inner leads and the semiconductor chip increases. To overcome potential reliability problems in the bonding wires, a short bonding wire may be implemented using a support tape 80 having an embedded routing pattern.

That is, as shown in FIGS. 7a and 7b, for each electrode pad of the semiconductor chip 30, an electrical connection is made to the first bonding pad 84 of the support tape 80 by a first bonding wire 62, and the bonding part of the inner lead is electrically connected to the second bonding pad 86 of the support tape 80 by a second bonding wire 64. Because the first and second bonding wires 62 and 64 are connected to the bonding pads 84 and 86, respectively, formed in the support tape 80, the length of the bonding wires 84 and 86 may be much shorter as compared with an embodiment where semiconductor chip 30 is connected to the inner lead by a single bonding wire. The first and second bonding pads 84 and 86 are preferably electrically connected to each other by the conductive routing pattern 87.

Although the routing pattern 87 is shown to be on the surface of the support tape 80 in FIG. 7b, a support tape 80 having a multi-layered structure and/or a multi-layered routing pattern may be used. With the multi-layer routing pattern, a lead frame structure having a bus bar lead for special device characteristics may be used. Herein, the bus bar lead means a lead having special shape (for instance, "⌐") that may be used to prevent bonding wires from intersecting each other due to device layout.

Thus, according to the embodiments of the present invention, it is possible to reduce the thickness of a semiconductor chip package to less than approximately 0.5 mm using plastic package processing technology. Also, it is possible to firmly support a semiconductor chip and a lead frame by using a film-type adhesive tape without increasing package thickness. Additionally, it is possible to provide highly reliable bonding wires in an ultra-thin package device for use in a case where many input/output pins are required.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An ultra-thin semiconductor package device, comprising:
   a semiconductor chip having an active surface in which a plurality of electrode pads are formed, and a bottom surface opposite of the active surface;
   a plurality of lead frames, each being connected to one of the plurality of electrode pads of the semiconductor chip, and each lead frame further including an inner lead having an upper surface, wherein the upper surface is aligned with the active surface of the semiconductor chip;
   a heat-resistant support tape having a plurality of electrode pad opening areas for exposing the plurality of electrode pads and a plurality of bonding pad opening areas for exposing a plurality of bonding parts of the inner leads, the heat resistant support tape attached to the upper surface of each inner lead and the active surface of the semiconductor chip, to support each inner lead and the semiconductor chip;
   a plurality of bonding wires each having a first end and a second end, the first end connected to one of the plurality of electrode pads through one of the plurality of electrode pad opening areas, the second end connected to an inner lead through one of the plurality of bonding pad opening areas; and
   a molding body encapsulating the semiconductor chip, the support tape and the plurality of bonding wires.

2. The ultra-thin semiconductor package device as claimed in claim 1, wherein the plurality of electrode pad opening areas of the support tape are individually aligned with each one of the plurality of electrode pads.

3. The ultra-thin semiconductor package device as claimed in claim 1, wherein the plurality of electrode pad opening areas of the support tape are formed as one body to align with a row of the plurality of electrode pads.

4. The ultra-thin semiconductor package device as claimed in claim 1, wherein the support tape includes an active surface opening area partially exposing a portion of the active surface of the semiconductor chip, and the exposed portion is directly contacted to the molding body.

5. The ultra-thin semiconductor package device as claimed in claim 1, wherein the support tape includes an active surface opening area partially exposing a portion of the active surface of the semiconductor chip, and the exposed portion is directly contacted to the molding body.

6. The ultra-thin semiconductor package device as claimed in claim 1, wherein a bottom surface of the molding body and the bottom surface of the semiconductor chip are aligned, and the bottom surface of the semiconductor chip is exposed.

7. The ultra-thin semiconductor package device as claimed in claim 1, wherein the support tape is wholly attached to the active surface of the semiconductor chip.

8. The ultra-thin semiconductor package device as claimed in claim 1, wherein the support tape is partially attached to the active surface of the semiconductor chip.

9. An ultra-thin semiconductor package device, comprising:
   a semiconductor chip having an active surface in which a plurality of electrode pads are formed, and a bottom surface opposite of the active surface;
   a plurality of lead frames, each being connected to one of the plurality of electrode pads of the semiconductor chip, and each lead frame further including an inner lead having an upper surface, wherein the upper surface is aligned with the active surface of the semiconductor chip;
   a heat-resistant support tape having a plurality of first bonding parts, a plurality of second bonding parts and a routing pattern connecting one of the plurality of first bonding parts with one of the plurality of the second bonding parts, attached to the upper surface of each of the plurality of inner leads and the active surface of the semiconductor chip, and supporting the plurality of inner leads and the semiconductor chip;
   a plurality of first bonding wires, each electrically connecting one of the plurality of electrode pads of the semiconductor chip to one of the plurality of the first bonding parts;
   a plurality of second bonding wires, each electrically connecting one of the plurality of the second bonding parts to one of the plurality of inner leads; and
   a molding body encapsulating the semiconductor chip, the support tape and the plurality of first and second bonding wires.

10. The ultra-thin semiconductor package device as claimed in claim 9, wherein the support tape further comprises a plurality of electrode pad opening areas and a plurality of bonding part opening areas for exposing the plurality of electrode pads of the semiconductor chip and a third bonding part of the inner lead to which one of the plurality of first and second bonding wires are attached, respectively.

11. The ultra-thin semiconductor package device as claimed in claim 9, wherein the routing pattern of the support tape has a multi-layered structure.

12. The ultra-thin semiconductor package device as claimed in claim 10, wherein the routing pattern of the support tape has a multi-layered structure.

13. The ultra-thin semiconductor package device as claimed in claim 9, wherein the support tape further includes an active surface opening area partially exposing a portion of the active surface of the semiconductor chip, and the exposed portion is directly contacted to the molding body.

14. The ultra-thin semiconductor package device as claimed in claim 10, wherein the support tape further includes an active surface opening area partially exposing a portion of the active surface of the semiconductor chip, and the exposed portion is directly contacted to the molding body.

15. The ultra-thin semiconductor package device as claimed in claim 1, wherein the package device has a thickness of less than 0.5 mm.

16. The ultra-thin semiconductor package device as claimed in claim 9, wherein the package device has a thickness of less than 0.5 mm.

* * * * *